United States Patent
Grandemenge et al.

(10) Patent No.: US 9,860,941 B2
(45) Date of Patent: Jan. 2, 2018

(54) FACILITY FOR MICROWAVE TREATMENT OF A LOAD

(75) Inventors: Adrien Grandemenge, Saint-Didier au Mont d'Or (FR); Jean-Marie Jacomino, Rilleux-la-Pape (FR); Marilena Radoiu, Lyons (FR); Louis Latrasse, Dardilly (FR)

(73) Assignee: SAIREM SOCIETE POUR L'APPLICATION, Miribel (FR)

( * ) Notice: Subject to any disclaimer, the term of this patent is extended or adjusted under 35 U.S.C. 154(b) by 685 days.

(21) Appl. No.: 14/114,422

(22) PCT Filed: Apr. 25, 2012

(86) PCT No.: PCT/FR2012/050903
§ 371 (c)(1),
(2), (4) Date: Jan. 20, 2014

(87) PCT Pub. No.: WO2012/146870
PCT Pub. Date: Nov. 1, 2012

(65) Prior Publication Data
US 2014/0197761 A1    Jul. 17, 2014

(30) Foreign Application Priority Data
Apr. 27, 2011  (FR) ..................... 11 53587

(51) Int. Cl.
*H05B 6/64*  (2006.01)
*H05B 6/74*  (2006.01)
(Continued)

(52) U.S. Cl.
CPC ...... *H05B 6/6447* (2013.01); *H01J 37/32009* (2013.01); *H01J 37/32192* (2013.01);
(Continued)

(58) Field of Classification Search
CPC ........... H01J 37/32009; H01J 37/32192; H01J 37/32201; H01J 37/32229;
(Continued)

(56) References Cited

U.S. PATENT DOCUMENTS

| | | | |
|---|---|---|---|
| 5,324,388 A | 6/1994 | Yamano et al. | |
| 6,080,270 A * | 6/2000 | Tabrez | H01J 37/32229 118/723 ME |

(Continued)

FOREIGN PATENT DOCUMENTS

| | | |
|---|---|---|
| EP | 0459177 A2 | 12/1991 |
| EP | 1643641 A2 | 4/2006 |

(Continued)

OTHER PUBLICATIONS

International Search Report dated Aug. 6, 2012 re: PCT/FR2012/050903; citing: EP 1 643 641 A2, Latrasse et al. High density distributed . . . , U.S. Pat. No. 5,324,388 A, EP 1 783 813 A1, EP 1 918 414 A1 and EP 0 459 177 A2.
(Continued)

*Primary Examiner* — Quang Van
(74) *Attorney, Agent, or Firm* — Cantor Colburn LLP

(57) ABSTRACT

The invention relates to a facility (1) for microwave treatment of a load, including: at least one application device (30); at least one solid-state generator (4) in the field of microwaves, connected to at least one application device by a means for guiding (5) the electromagnetic wave; at least one frequency adjustment system (40) designed for adjusting the frequency of the wave produced by the corresponding generator (4); a measurement system (31) for the or each application device (30), designed for measuring the power reflected $P_{R(i)}$ by the application device (30); an automated control means (6) connected to each frequency adjustment system (40) and to each measurement system (31) in order (Continued)

to control the adjustment of the frequency $f_{(i)}$ of the electromagnetic wave according to the reflected power, in order to adjust the reflected power $P_{R(i)}$ and/or to adjust the transmitted power $P_{T(i)}$.

4 Claims, 5 Drawing Sheets

(51) Int. Cl.
    *H05B 6/66* (2006.01)
    *H01J 37/32* (2006.01)

(52) U.S. Cl.
    CPC .. *H01J 37/32201* (2013.01); *H01J 37/32229* (2013.01); *H01J 37/32266* (2013.01); *H01J 37/32302* (2013.01); *H01J 37/32311* (2013.01); *H01J 37/32678* (2013.01); *H05B 6/664* (2013.01); *H05B 6/74* (2013.01)

(58) Field of Classification Search
    CPC ........... H01J 37/32266; H01J 37/32302; H01J 37/32311; H01J 37/32678; H05B 6/6447; H05B 6/74; H05B 6/664
    USPC ....... 219/756, 750, 709, 716, 620, 438, 490, 219/492, 482, 702, 761; 315/502; 422/186; 250/492; 438/706; 118/723 ME, 723 MW
    See application file for complete search history.

(56) References Cited

U.S. PATENT DOCUMENTS

| | | | | |
|---|---|---|---|---|
| 2006/0081624 A1* | 4/2006 | Takada | ............. | H01J 37/32192 219/716 |
| 2010/0224623 A1* | 9/2010 | Yasui | .................... | H05B 6/686 219/702 |
| 2010/0296977 A1* | 11/2010 | Hancock | .................. | A61L 2/14 422/186 |

FOREIGN PATENT DOCUMENTS

| | | |
|---|---|---|
| EP | 1783813 A1 | 5/2007 |
| EP | 1918414 A1 | 5/2008 |
| WO | 0120710 A1 | 3/2001 |

OTHER PUBLICATIONS

L. Latrasse et al. "High density distributed microwave plasma sources in a matrix configuration: concept, design and performance", Plasma Sources Science and Technology, Feb. 1, 2007, pp. 7-12, vol. 16, No. 1, Institute of Physics Publishing, Bristol GB. xp020120254.

* cited by examiner

FACILITY FOR MICROWAVE TREATMENT OF A LOAD

TECHNICAL FIELD

The present invention relates to a facility for microwave treatment of a load, and an associated microwave treatment method.

The subject-matter of the invention falls within the field of microwave treatment comprising treating a load absorbing microwaves by applying electromagnetic waves in the microwave range thereon; this load may comprise a liquid, solid or gaseous product having dielectric characteristics allowing it to absorb all or part of the wave, for example such as an aqueous suspension, an agri-food or chemical product, a plasma-forming gas, etc., such a load being able to be contained inside a treatment chamber.

A first application relates to facilities for microwave treatment by producing, in a treatment chamber, a plasma excited by a microwave radiation for various applications, for example and non-limitingly, surface treatment applications, such as etching or material layer deposition, in particular diamond, chemical or thermochemical treatment, spraying, decontamination, sterilization, cleaning, nitriding, ion implantation, disinfection, etc.

A second application relates to microwave treatment facilities using heating of a load absorbing the microwave radiation, in particular in the chemical, medical and agri-food fields.

The invention more particularly relates to a facility for microwave treatment of a load, comprising:

at least one application device for applying an electromagnetic wave in the microwave range;

at least one electromagnetic wave generator in the microwave range, connected to at least one application device applying the electromagnetic wave using guide means.

A first application of the present invention is to make it possible to monitor the power reflected on the or each application device, so as preferably to ensure impedance matching on the or each application device by canceling or even minimizing the power reflected on the or each application device.

A second application of the present invention is to allow monitoring of the power transmitted by the or each application device, so as preferably to distribute the transmitted power equitably between the various application devices so as to obtain a substantially uniform power density on a given treatment area, for example at a certain distance from the walls of the treatment chamber. In the case of a microwave treatment facility working by producing a plasma, it is in fact interesting to obtain a substantially uniform plasma having a substantially uniform power density.

In the case of a microwave treatment facility using the production of an electron cyclotron resonance (ECR) plasma, a third application of the present invention is to make it possible to monitor the resonance surface in the vicinity of the or each application device, and therefore to monitor the creation surface of the plasma in the vicinity of the concerned application device, in the particular case of a plasma.

BACKGROUND

FIGS. 1 and 2 illustrate a traditional microwave treatment facility for treatment by producing a plasma, in particular known from document WO 01/20710 A1, which comprises:

a reactor 99 having a treatment chamber 90 (or plasma chamber) in the volume of which the plasma is produced;

several elementary plasma sources 91 each comprising an application device 92 inside the treatment chamber 90 for applying an electromagnetic wave in the microwave range; and an electromagnetic wave generator 93 in the microwave range, connected to the application devices 92 by guide means 94 for guiding the electromagnetic wave.

During operation, the generator 93, traditionally of the magnetron type, produces an electromagnetic wave at a fixed frequency in the microwave range. For example, a magnetron 93 makes it possible to provide a variable microwave power from 0 to 2 kW at a fixed frequency of 2.45 GHz.

The electromagnetic wave delivered by the magnetron 93 is sent to a power divider 95 designed to divide the microwave power by the number k of application devices 92, generally by 2, 4, 8, 10, 12, etc. In the example of FIG. 2, the number k of application devices 92 is equal to 12.

The power divider 95 is generally made up of a rectangular waveguide in which k antennas are installed each debiting 1/k of the total power delivered by the magnetron 93. In this architecture of the power divider 95, the antennas are positioned in the guide, in which stationary waves are established, in the antinodes of the electromagnetic field. This technology is effective inasmuch as each elementary plasma source 91 behaves like a matched impedance, in other words the power reflected on each application device 92 is substantially zero such that each elementary source 91 sends, without loss, all of the debited power through the corresponding antenna.

The power debited by each antenna is then transmitted by independent guide means 94, typically of the coaxial cable type, to one of the application devices 92 through a circulator 96 equipped with a suitable water load placed at the output of the power divider 95. This circulator 96 allows the power debited by each antenna to go from the power divider toward the application devices 92, but it prevents the reflected power from going from the application device 92 to the antenna by redirecting the reflected power onto a load, in this case the water load.

The coaxial cables 94 transmit the power to the application devices 92, traditionally called applicators, through an impedance matching device 97, or tuner, place just before the corresponding applicator 92. The impedance adjustment between the plasma confined in the treatment chamber 90 and each elementary plasma source 91 is done by manually manipulating the impedance matching device 97 of each concerned line, so as to make it possible to minimize the power reflected on each applicator 92.

FIG. 3 illustrates a first example of a reactor 99a for a plasma production facility, using application devices 92 of the coaxial applicator type with an impedance matching device 97 for each coaxial applicator 92. The coaxial applicators 92 emerge in the treatment chamber 90 on the cylindrical wall of the reactor 99a. This first reactor 99a is a deposition/low-pressure etching reactor where each elementary plasma source 91 further comprises a magnetic structure 98 designed to create a magnetic field which, coupled to an electromagnetic wave with a given frequency, makes it possible to produce an electron cyclotron resonance (ECR) plasma.

In that case, the elementary plasma sources 91 are said to be elementary sources with ECR coupling or dipolar sources. The magnetic structures are traditionally made in the form of permanent magnets 98, for example formed by cylindrical magnets (magnetic dipole), positioned on the ends of the coaxial applicators 92.

This type of reactor 99a, implementing a technique for exciting the electron cyclotron resonance plasma, commonly called ECR, is particularly well suited for applications in physical vapor deposition (PVD) or plasma etching, by using a substrate holder PS that can be polarized and a target holder PC that can be polarized, which are positioned in the treatment chamber 90 on two other opposite and parallel walls of the reactor 99a. This type of reactor 99a is also suitable for plasma-assisted chemical vapor deposition (PACVD), hybrid methods combining PVD and PACVD, and reactive spraying. This type of reactor 99a typically operates at pressures below a pascal (Pa), but may go up to several thousand pascals depending on the application.

FIG. 4 illustrates a second example of a reactor 99b for a plasma production facility, using application devices 92 of the coaxial applicator type with an impedance matching device 97 for each coaxial applicator 92. The coaxial applicators 92 emerge in the treatment chamber 90 on a same wall of the reactor 99b. In this second reactor 99b, the elementary plasma sources 91 do not comprise any magnetic structure.

This type of reactor 99b is particularly well suited for applications in deposition/medium-pressure etching, for example for PACVD (plasma-assisted chemical vapor deposition) or plasma etching, by using a substrate holder PS that can be polarized positioned in the treatment chamber 90 on a wall of the reactor 99b situated across from the coaxial applicators 92. With this type of reactor 99b, the chemical deposition methods work very well in an intermediate pressure range, in the vicinity of 100 pascals (Pa), thereby making it possible to obtain high deposition speeds, but can operate more accurately from several pascals to several tens of thousands of pascals depending on the applications.

These traditional facilities for producing a microwave-excited plasma nevertheless have many drawbacks, which are also encountered in the microwave treatment facilities applied to chemistry in treatment chambers of the reactor type, agri-food in treatment chambers of the heating cavity type, etc.

A first drawback pertains to the limitations inherent to the impedance matching devices 97 to match the independence on each application device, such impedance matching devices furthermore also being used in microwave treatment facilities applied to chemistry, medicine (e.g., treatment of a part of the body, such as a tumor, by microwave radiation), or agri-food (e.g., heating or sterilization of food by microwave radiation).

In a known manner, impedance matching is a technique making it possible to optimize the transfer of power or electromagnetic energy, in the case at hand a microwave power or energy, between a transmitter, in this case the electromagnetic wave generator, and an electrical receiver called a load, i.e., the plasma confined in the treatment chamber.

Thus, as described above, in a microwave treatment facility, it is traditional to use one or more impedance matching devices situated between the application device and the electromagnetic wave generator, in order to optimize the performance. The impedance matching is said to be optimal when the power reflected by the plasma is zero, or at least as low as possible.

However, any load, such as a plasma, a chemical or gaseous reactive mixture, a solid product, etc., has an impedance that varies over time as a function of the operating conditions implemented, for example the pressure in the treatment chamber, the temperature in the treatment chamber, the nature of the gas(es) introduced into the treatment chamber to create the plasma, the proportions of those gases, the power transmitted to the load, the nature of the electromagnetic energy transmitted to the load, etc., as well as depending on the characteristics of the treatment chamber, for example the material used for its walls, its dimensions, its geometry, the surface state of its walls, etc.

Thus, the more application devices the installation has, the more complicated and restrictive the impedance matching is, in particular if each application device has its own manual impedance matching device and matching must be done for each application device and optionally for each operating condition. An impedance matching device may assume many forms and can also be integrated into the applicator.

In reference to FIGS. 2 to 4, a coaxial impedance matching device 97 with dielectric generally comprises two rings 970 concentric to the coaxial core, said concentric rings 970 being movable along the axis of the coaxial cable 94 to vary the impedance at the input of the impedance matching device 97. The concentric rings 970 constitute dielectric discontinuities which, when they are moved, make it possible to adjust the reflection coefficient. Thus, by moving the concentric rings 970, at the input of the matching device, a reflected wave is created in phase opposition with the wave reflected by the associated applicator but with the same amplitude, thus the resultant of the reflected powers is zero and the system is matched.

During a microwave treatment method, the operating conditions often change during the method, and users generally perform an average adjustment and set impedance matching devices. In this way, the impedance matching will be acceptable for the various operating conditions used during the method, but will not be optimized for each operating condition, unless the user manually redoes the matching each time these operating conditions change.

It is also known to use automatic impedance matching devices in the field of plasma production, which integrate electronic control devices controlling the movement of the mechanical elements. However, these automatic impedance matching devices are particularly complex and costly due to the electronic control devices, and not very reactive, since they require controlling mechanical elements between several positions.

A second drawback relates to the difficulty of controlling or regulating the power transmitted over each application device, or even distributing the power transmitted between the different application devices equitably; a good distribution for example favoring homogenous heating of an agri-food product or a chemical composition or mixture, in particular to favor volume targeted reactions inside a chemical reactor, or the production of a uniform plasma, in terms of volume or surface, in the treatment chamber and at a given distance from the or its walls.

In fact, this difficulty arises, inter alia, from the power dividers, which are not fully satisfactory. In the case of a magnetron generator, the greatest problem lies in the power division. In fact, the power dividers are designed to divide the microwave power at 2.45 GHz equitably between several antennas. However, the frequency of the wave emitted by the magnetron generator varies with the power, and therefore the division will only be equitable for a limited power range, which, additionally, will be different from one generator to the next.

This difficulty also comes from the application devices, which may have variable reflected powers from one application device to another. By using several application devices powered by a same generator, in some cases, it is possible to see and influence of the impedance of one application device on the other application devices, in the absence of a sufficient separation between the power supply lines for the different application devices. Imbalances are thus observed between the powers transmitted by the application devices, which harm the uniformity of the heating or the plasma in the treatment chamber.

It should be noted that inequitable distribution of the power transmitted to the load by the different application devices favors the production of homogenous heating or a uniform plasma in the treatment chamber, at least up to a certain distance from the application devices, but does not alone guarantee that such uniformity will be obtained, since that uniformity depends on the diffusion of the heating or the plasma in the treatment chamber, which in turn primarily depends, directly or indirectly, on the operating conditions (pressure, transmitted power, characteristics of the load, product or mixture to be treated, etc.) and the dimensions and shape of the treatment chamber.

In a first example facility, illustrated in FIGS. 1 and 4, the application devices are distributed in a same plane, called source plane, based on a given mesh, for example square or hexagonal. By distributing the power transmitted between these application devices equitably, a localized plasma is obtained at the end of each applicator and, by diffusion, a substantially uniform plasma is obtained in terms of density of the plasma at a certain distance from the source plane. However, moving further away from the source plane, it is possible to observe a density variation of the plasma. In this scenario, we refer to surface uniformity of the plasma, as this corresponds to a uniformity of the plasma in planes parallel to the source plane.

In the second example facility, illustrated in FIG. 3, the application devices are distributed in crowns on the cylindrical wall of the cylindrical reactor. By distributing the power transmitted between these application devices equitably, a substantially uniform plasma is obtained in terms of density of the plasma at a certain distance from the cylindrical wall. It is thus possible to obtain a uniformity over a large volume of the treatment chamber, and we then speak of volume uniformity of the plasma, since this type of facility generally operates at very low pressures; a low pressure favoring the diffusion of the species.

A third drawback relates to the difficulty of monitoring the resonance surface in the specific case of facilities using the electron cyclotron resonance plasma excitation technique.

In the presence of a uniform magnetic field B, the trajectories of the electrons are helixes wound around field lines. The electrons have an angular speed ω satisfying the following equation:

$$\omega = 2\pi \cdot f = e \cdot B/m,$$

where m and e respectively correspond to the mass and the charge of the electron.

When an alternating pulsed uniform electrical field $\omega_P$ is superimposed on the magnetic field B, the electrons, in addition to their helical movements, undergo forces at the frequency $f_P = \omega_P/2\pi$.

With the ECR technique, the resonance is obtained when the gyration frequency of an electron in a static or quasi-static magnetic field is equal to the frequency of the applied accelerator electrical field. In other words, for $\omega = \omega_P$, the electron cyclotron resonance condition is obtained, the component of the speed of the electrons perpendicular to the magnetic field B increases, giving the electrons a helical spiral trajectory (the trajectory perpendicular to the field lines B is a spiral). Thus, a significant amount of energy is transmitted to the electrons, making it possible to ionize the neutral species of the gas easily during collisions. This type of plasma operates in a pressure range of approximately $10^{-3}$ mbar (0.1 Pa), which corresponds to a pressure low enough to allow the electrons to acquire enough energy between two collisions, but not too low for there to be enough ionizing collisions to maintain the plasma.

Thus, the creation area of the excited species depends on the magnetic field B and the frequency f of the emitted wave. However, currently, it is difficult to monitor the location of the creation zone, in other words, to monitor the resonance surface, knowing that such monitoring may have many advantages to modify the density of the plasma and therefore to optimize the performance of the installation.

The state of the art may also be illustrated by the teaching of patent application EP 1,643,641 A2, which discloses a microwave treatment facility by producing a plasma that uses a solid-state generator to excite the plasma, using an amplifier on the transmission line of the wave. This patent application describes the possibility of automatically performing impedance matching by controlling only a traditional "matching unit" matching device, with all of the aforementioned drawbacks.

BRIEF SUMMARY

The present invention aims to resolve all or part of these drawbacks, by proposing a microwave treatment facility that makes it possible to monitor the power reflected on the or each application device so as to perform the impedance matching, monitor the power transmitted by the or each application device so as in particular to distribute the power transmitted between the different application devices equitably to optionally obtain heating or plasma that is substantially uniform in volume or in surface, in a treatment chamber, at a given distance from the or its walls, and to monitor the resonance surface in the particular case of facilities using the electron cyclotron resonance plasma excitation technique.

To that end, it proposes a facility for microwave treatment of a load, comprising at least one application device for applying an electromagnetic wave in the microwave range;

at least one electromagnetic wave generator in the microwave range of the solid-state generator type, connected to at least one application device by means for guiding the electromagnetic wave;

a frequency adjustment system for the or each generator, designed to adjust the frequency $f_{(i)}$ of the electromagnetic wave produced by the corresponding generator;

a measurement system for the or each application device, designed to measure the power reflected $P_{R(i)}$ by the corresponding application device; and automated control means connected to each frequency adjustment system and designed to control the adjustment of the frequency $f_{(i)}$ of the electromagnetic wave by the or each frequency adjustment system and connect, on the other hand, to the or each measurement system in order to:

e1) receive, as input and in real-time, the reflected power measurement $P_{R(i)}$ from the or each measurement system; and e2) command the or each frequency adjustment system to vary the frequency $f_{(i)}$ of the electromagnetic wave produced by the or each generator, until at least one of the following conditions is met:

a) the reflected power $P_{R(i)}$ measured by the or each measurement system substantially reaches a first reference value $V_{R(i)}$; or
b) the power transmitted $P_{T(i)}$ by the or each application device substantially reaches a second reference value $V_{T(i)}$, the transmitted power $P_{T(i)}$ corresponding to the difference between the incident power $P_{IN(i)}$ transmitted to the corresponding application device and the reflected power $P_{R(i)}$ measured on that same application device, or the following relationship:

$$P_{T(i)} = P_{IN(i)} - P_{R(i)}.$$

By implementing the adjustment of the frequency of the electromagnetic wave produced by the or each solid-state generator, while of course remaining in the microwave range, the invention makes it possible to simply and effectively resolve various problems raised by the state of the art. In fact, the frequency directly influences the reflected power, and therefore the impedance matching, the transmitted power, and therefore a uniformity of the plasma, and also the resonance surface in the case of facilities implementing the electron cyclone resonance plasma excitation technique.

The invention comprises using one or more solid-state generators and one or more frequency adjustment systems (in this case one generator) making it possible to vary the frequency of the electromagnetic wave generated by the corresponding solid-state generator.

The solid-state generators, also called electromagnetic wave transistor generators, are in fact well suited for varying the frequency of the wave automatically (for example with a computerized monitoring program on a computer or with a robot), for each application device.

In terms of definitions of the powers, we have: $P_{T(i)}$ corresponds to the power transmitted by the application device (i) to the load, $P_{R(i)}$ corresponds to the power reflected by the application device (i), $P_{IN(i)}$ corresponds to the incident power transmitted to the application device (i) by the associated generator; this incident power $P_{IN(i)}$ being equal to the power provided by the concerned generator, to within the feed losses, if a generator powers a single and same application device.

With the invention, three preferred uses, which are not necessarily limiting, can be considered.

A first use of the invention comprises varying the frequency of the wave produced by the or each generator, to control the reflected power $P_{R(i)}$ on the or each application device (i). In this way, it is possible to minimize, potentially to the point of canceling out, the reflected power $P_{R(i)}$ on the or each application device (i), thereby performing impedance matching.

For the impedance matching, several phenomena must be taken into account: one being that the impedance of the load itself, for example in the case of a plasma or certain reactive chemical products, changes locally, since it depends, inter alia, on the power transmitted to the load, which in turn depends on the impedance matching, therefore also on the frequency, since that influences the impedance matching.

In this first use, the invention makes it possible to do away with the impedance matching devices in certain cases, but in other cases, it offers an additional degree of adjustment for the impedance matching without completely eliminating the impedance matching devices. Thus, if the impedance adjustment is satisfactory at the beginning of a method (with or without the use of impedance matching devices) and the load becomes mismatched (for example during a change in operating conditions), then the invention makes it possible to match the impedance once again by varying the frequency f(i) of the electromagnetic wave, for the generator or for each generator individually.

Thus, owing to the invention, whatever the cause of the impedance discord (at the beginning or during the method), the reflected power can be minimized, or even canceled out, by varying the frequency of the electromagnetic wave, irrespective of the type of application device. In fact, the invention is not limited to a specific architecture of the application device(s), which may be of the coaxial applicator type (with or without magnetic structure), discharge tube (surfatron, Evenson cavity, downstream source, semi-metallic plasma torch, etc.), antenna, waveguide with dielectric window, etc. type.

This innovation is of interest in all microwave treatment applications, for example such as a heating or microwave radiation application method in a chemical reactor, a plasma method (etching, material layer deposition, chemical or thermochemical treatment, spraying, decontamination, sterilization, cleaning, nitriding, ion implantation, disinfection, etc.), a medical treatment method using microwave radiation, since all of these applications require impedance matching in order to optimize the performance in terms of ion density, reactive species density, density of excited species, partial temperatures of the species, etc.

The second use of the invention comprises varying the frequency $f_{(i)}$ of the wave produced by the or each generator, to monitor the power transmitted $P_{T(i)}$ to the load by the or each application device (i). In this way, it is possible to distribute the power transmitted $P_{T(i)}$ between the different application devices (i) equitably, in other words to have substantially the same transmitted power $P_{T(i)}$ for each application device, to optionally obtain a uniform heating or plasma in terms of volume or surface in the treatment chamber, at a given distance from the or its walls.

Such monitoring of the power transmitted on each of the application devices (i) also makes it possible to create local disparities, by having application devices (i) not all transmit the same power $P_{T(i)}$ so as for example to compensate the edge effects (which may be due to a loss of density of the plasma near the walls) to favor uniform deposits or, conversely, to create density gradients of the plasma for example to produce progressive depositions, non-uniform depositions, or depositions with controlled deposition speeds.

In the first two uses, the invention makes it possible to monitor, by varying the frequency $f_{(i)}$ for the or each application device (i), the reflected power $P_{R(i)}$ or transmitted power $P_{T(i)}$ on each application device (i), whether to minimize the reflected power $P_{R(i)}$ out of a concern for impedance matching or to cause the transmitted power $P_{T(i)}$ to assume a predefined value.

In fact, for each application device (i) (i being an integer comprised between 1 and N, N being the number of application devices), the transmitted power $P_{T(i)}$ corresponds to the difference between the incident power $P_{IN(i)}$ transmitted to the corresponding application device (the incident power being equal, to within the feed losses, to the power provided by the associated generator in the case where a generator powers a single application device) and the reflected power $P_{R(i)}$ on that same application device, i.e., the following relationship:

$$P_{T(i)} = P_{IN(i)} - P_{R(i)}.$$

Thus, monitoring the reflected power $P_{R(i)}$ by varying the frequency $f_{(i)}$ results in monitoring the transmitted power $P_{T(i)}$, and vice versa. It is of course possible to consider playing, in addition to the frequency $f_{(i)}$, on the incident power $P_{IN(i)}$ to regulate the transmitted power $P_{T(i)}$, knowing that it is possible to play on the incident power $P_{IN(i)}$ in particular by playing on the power provided by the associated generator.

A third use of the invention, which relates to facilities implementing the Electron Cyclotron Resonance (ECR) plasma technique, comprises varying the frequency of the wave produced by the or at least one generator, to monitor the resonance surface on the or each application device and therefore the power density of the plasma in an area of the treatment chamber close to the application device in question.

According to one characteristic, the or each frequency adjustment system is designed to adjust the frequency of the electromagnetic wave in a frequency range chosen in the microwave range, for example in a frequency range comprised between approximately 2400 and 2500 MHz, or for example between approximately 5725 and 5875 MHz, or even in another predetermined frequency range belonging to the microwave range.

For example, in the case of a variable frequency range between 2400 and 2500 MHz, the generator delivers an electromagnetic wave with a central frequency of 2450 MHz, with a variation of plus or minus 50 MHz around a central frequency, thus remaining in the microwave range; this variation over a total range of 100 MHz making it possible to respond to most of the issues encountered in terms of impedance matching around 2450 MHz.

Of course, the invention is not limited to this specific frequency range, or a given central usage frequency. The present invention is valid in the microwave range, and the choice of frequency range will essentially depend on the technology of the solid-state generator(s) used in the facility, as well as the standards and/or regulations in use.

According to one possibility of the invention, the facility comprises at least two generators each associated with the frequency adjustment system and at least two application devices, each generator being connected to at least one application device.

In this configuration, each generator delivers its electromagnetic wave to one or more application devices. By using several generators, the possibilities for individual adjustment of the reflected power, the transmitted power and/or the resonance surface are improved, application device by application device, while limiting the interactions between the application devices.

As a comment, if a generator is associated with several application devices (i), the frequency $f_{(i)}$ for those application devices (i) is the same for each of them and corresponds to the frequency of the wave generated by that shared generator.

The or each solid-state generator may be formed by a single and same generator at a given power, or several sub-generators. For example, for a solid-state generator delivering a power of 200 W, it is possible to have either a single and same solid-state generator with a power of 200 W, or to have two solid-state sub-generators each with a power of 100 W. Of course, the sub-generators must be in phase and therefore include a shared frequency adjustment system.

According to another possibility of the invention, the facility comprises N generators each associated with a frequency adjustment system, and N application devices, where N is an integer greater than 2, each generator being connected to a single application device.

This configuration is particularly advantageous, since each application device (i) is provided with microwave power or energy by a single and same generator, and conversely, each generator supplies a single and same application device. Thus, no power divider is necessary, and the adjustment of power reflected on each application device is done by adjusting the frequency on the corresponding generator, independently between the application devices, thereby limiting the problems of interactions between the application and division devices of the electromagnetic waves.

Furthermore, it should be noted that the frequency $f_{(i)}$ for the or each generator is adjusted in response to an automated command which the automated control means, for example of the robot, processor or computer type.

The advantage of automated control means is being able to perform an automatic frequency adjustment for each generator, for example until the reflected power $P_{R(i)}$ is minimized on the application devices (i), for impedance matching, monitoring of the transmitted power $P_{T(i)}$ on the application devices (i) and monitoring of the resonance surfaces.

The embodiment according to the invention is particularly suitable for monitoring the reflected power $P_{R(i)}$ allowing the impedance matching (condition a), and for regulating the transmitted power $P_{T(i)}$, in particular making it possible to obtain a uniform plasma (condition b). As a reminder, monitoring the reflected power $P_{R(i)}$ by varying the frequency results in monitoring the transmitted power $P_{T(i)}$, and vice versa. In other words, the two conditions a) and b) are substantially equivalent.

Each application device (i) has a corresponding first reference value $V_{R(i)}$ of the reflected power $P_{R(i)}$ and second reference value $V_{P(i)}$ for the transmitted power $P_{T(i)}$. In other words, the reference values $V_{R(i)}$ and $V_{P(i)}$ are not necessarily equal from one application device (i) to the next.

More concretely, when a change occurs in the operating conditions, the automated control means will be informed in real-time of a variation of the reflected power $P_{R(i)}$ on one or more application devices (i) (condition a) or a variation in the transmitted power $P_{T(i)}$ by one or more application devices (i) (condition b), after receiving measurements from the measurement systems, and, by a simple feedback loop, the automated control means will regulate the reflected power $P_{R(i)}$ and in particular minimize it (condition a), or regulate the transmitted power $P_{T(i)}$, in particular so that it is the same on each application device (condition b) by varying the frequency $f_{(i)}$ of the electromagnetic wave for the application device (i). Thus, the impedance matching (condition a) or the regulation of transmitted power (condition b), for example in order to obtain the uniformity of the heating or the plasma, is done automatically.

More generally, the reflected $P_{R(i)}$ or transmitted $P_{T(i)}$ power may be regulated automatically by the control means according to a feedback loop by varying the frequency $f_{(i)}$ of the electromagnetic wave, irrespective of the type of application device (i). As more specifically described below, it is of course possible to consider playing, in addition to the frequency $f_{(i)}$, on the incident power $P_{IN(i)}$ to regulate the transmitted power $P_{T(i)}$.

In one particular embodiment, the first reference value $V_{R(i)}$ corresponds, for the or each application device (i), to a minimum of the reflected power $P_{R(i)}$ measured in order to perform impedance matching on the or each application device (i); that minimum optionally being equal or close to zero. That reflected power minimum may of course correspond to a predetermined threshold reflected power that is set by default in the program or by the user, either in terms of threshold power expressed in watts or in terms of percentage of the ratio of the reflected power to the incident power.

This embodiment therefore leads to impedance matching, the first reference value that the reflected power $P_{R(i)}$ will reach on each application device (i), following a feedback loop, is set substantially at zero, or at least at a minimum accessible value, which results in automatically minimizing the reflected power $P_{R(i)}$ on each application device (i) by varying the frequency $f_{(i)}$ of the electromagnetic wave. In other words, for the impedance matching, the automated control means will vary the frequency $f_{(i)}$ until a minimum of the reflected power $P_{R(i)}$ is found.

According to one advantageous embodiment where the facility comprises several application devices (i), the second reference value $V_{T(i)}$ corresponds, for each application device (i), to a predetermined set point $VC_T$ that is identical for each of the application devices (i), so as in particular to favor the obtainment of a uniform heating or plasma in volume or in surface in the treatment chamber, at a given distance from the wall(s) delimiting said treatment chamber, by distributing the power transmitted to the load substantially equitably.

This embodiment therefore results in regulating the transmitted power $P_{T(i)}$ on each of the application devices (i), which is particularly interesting for plasma methods requiring considerable uniformity, this automatic regulation of the transmitted power $P_{T(i)}$ on each application device (i) seeking to obtain the same transmitted power $P_{T(i)}$ on each application device (i). In other words, the goal is no longer to systematically minimize the reflected power $P_{R(i)}$ on each application device (i) (for the impedance matching), but have the same transmitted power $P_{T(i)}$ on each application device (i).

Thus, to regulate the power transmitted $P_{T(i)}$ to an application device (i), the automated control means vary the frequency $f_{(i)}$, and optionally additionally the incident power $P_{IN(i)}$, so that the power transmitted on the application device $P_{T(i)} = P_{IN(i)} - P_{R(i)}$ is equal to the desired set point for that same application device; $P_{T(i)}$ and $P_{R(i)}$ being functions of the frequency $f_{(i)}$ and the incident power $P_{IN(i)}$.

To favor the obtainment of a uniform heating or plasma, at least at certain distances from the application devices, each application device (i) will therefore receive the same set point $VC_T$ for the transmitted power $P_{T(i)}$, such that the transmitted powers $P_{T(i)}$ of the different application devices (i) are all equal, knowing that the incident power $P_{IN(i)}$ may vary from one application device (i) to another.

For example, the application device (1) has 150 W of incident power (i.e., $P_{IN(1)}=150$ W) and 10 W of reflected power (i.e., $P_{R(i)}=10$ W), while the application device (2) has 142 W of incident power (i.e., $P_{IN(2)}=142$ W) and 2 W of reflected power (i.e., $P_{R(2)}=2$ W). Thus, the application device (1) and the application device (2) for each transmit a transmitted power to the plasma $P_{T(1)}=P_{T(2)}=140$ W. This situation corresponds to making the reflected power $P_{R(1)}$ for the application device (1) subject to the value of 10 W and making the reflected power $P_{R(2)}$ for the application device (2) subject to the value of 2 W, by playing on the frequency $f_{(1)}$ of the electromagnetic wave on the application device (1) on the one hand and on the frequency $f_{(2)}$ of the electromagnetic wave on the application device (2) on the other hand. If applicable, it is also possible to play on the incident power $P_{IN(1)}$ on each of the application devices (i), by acting on the generators associated with the application devices (i).

Alternatively, and still in the context of condition b) and the regulation of the transmitted power $P_{T(i)}$, it is also possible to consider the automated control means varying the frequency $f_{(i)}$, and optionally additionally the incident power $P_{IN(i)}$ so that the transmitted power $P_{T(i)}$ varies from one application device (i) to the other. In this case, the second reference values $V_{T(i)}$ are not all identical, so as for example to obtain a controlled disparity of the heating or plasma in the treatment chamber.

This alternative is of interest if one wishes for a desired disparity on the application devices, in particular to compensate edge effects or to create a power gradient transmitted along a line of application devices so as for example to perform progressive depositions, obtain a variable intensity surface treatment, or perform a progressive monitoring of the treatment during a continuous method.

According to one possibility of the invention where the facility comprises several application devices (i), the automated control means are connected to the or each generator so as to receive, as input, the value of the incident power $P_{IN(i)}$ associated with each application device (i), and the control means are designed to meet condition b) by carrying out the following sub-steps during the monitoring step e2):

e3) calculating, for each application device (i), a set point $VC_{R(i)}$ of the reflected power $P_{R(i)}$ corresponding to a power transmitted $P_{T(i)}$ by the application device (i) equal to the second reference value $V_{T(i)}$, i.e. $VC_{R(i)} = P_{IN(i)} - V_{T(i)}$;

e4) monitoring, for each application device (i), the frequency adjustment system in question to vary the frequency $f_{(i)}$ of the electromagnetic wave produced by the associated generator, so as to subject the reflected power $P_{R(i)}$ to said set point $VC_{R(i)}$.

In this way, a feedback loop is produced on the reflected power $P_{R(i)}$ for each application device (i), so as to meet condition b), and therefore regulate the transmitted power $P_{T(i)}$.

According to another possibility of the invention, the control means control the or each generator in terms of power so that the or each generator delivers a given incident power $P_{IN(i)}$, and the control means are designed to carry out step e2), and meet conditions a) and/or b), by monitoring both the or each frequency adjustment system to vary the associated frequency $f_{(i)}$, and the or each generator to vary the associated incident power $P_{IN(i)}$.

In this way, the control means play, for the or each application device, both on the frequency and the incident power to meet condition a) and/or condition b). Additionally, playing on the incident power makes it possible in fact to refine the regulation of the reflected power and/or the transmitted power, these two powers themselves depending on both the frequency and the incident power.

Advantageously, in the context of this dual frequency and incident power control, the control means are designed, during sub-step e4), to monitor, for the or each application device (i), both:

the concerned generator so that it delivers an incident power $P_{IN(i)}$ at a given set point $VC_{IN(i)}$ which is optionally variable; and the concerned frequency adjustment system in order to vary the frequency $f_{(i)}$ of the electromagnetic wave produced by the associated generator, so as to make the reflected power $P_{R(i)}$ subject to the set point $VC_{R(i)}$, which satisfies the following relationship:

$$VC_{R(i)} = VC_{IN(i)} - V_{T(i)}.$$

This technique is advantageous, as it makes it possible to play both on the frequency $f_{(i)}$ and the incident power $P_{IN(i)}$ in order to meet condition b), and therefore regulate the transmitted power $P_{T(i)}$. It is of course understood that it is possible to vary the set point $VC_{IN(i)}$ of the incident power $P_{IN(i)}$ during adjustment, to ultimately obtain the best regulation of the transmitted power $P_{T(i)}$.

In one advantageous embodiment where the facility comprises several application devices, the control means are connected to the or each generator in order to receive, as input, the value of the incident power $P_{IN(i)}$ associated with each application device and control the or each generator in terms of power so that the or each generator delivers a given incident power $P_{IN(i)}$ and the control means are designed to meet both conditions a) and b) by carrying out the following sub-steps during the monitoring step e2):

e5) monitoring each frequency adjustment system to vary the frequency $f_{(i)}$ of the electromagnetic wave produced by the concerned generator until condition a) is met, such that each reflected power $P_{R(i)}$ is equal to the first corresponding reference value $V_{R(i)}$;

e6) calculating, for each application device, a set point $VC_{IN(i)}$ of the incident power $P_{IN(i)}$ corresponding to a transmitted power $P_{T(i)}$ by the application device equal to the second reference value $V_{T(i)}$, i.e., $VC_{IN(i)} = V_{R(i)} + V_{T(i)}$;

e7) controlling the or each generator so that it delivers an incident power $P_{IN(i)}$ at the set point $VC_{IN(i)}$, so as to meet condition b).

This embodiment is advantageous, since it makes it possible to play first on the frequency $f_{(i)}$ to meet condition a) (and therefore ensure regulation of the reflected power $P_{R(i)}$, in particular out of concern for impedance matching), and next to play on the incident power $P_{IN(i)}$ to meet condition b) (and therefore ensure regulation of the transmitted power $P_{T(i)}$, in particular out of a concern for uniformity of the heating or plasma).

Of course, during the adjustment of the incident power $P_{IN(i)}$ (step e7)), the value of the reflected power $P_{R(i)}$ may change, therefore the incident power $P_{IN(i)}$ must vary effectively until its set point $VC_{IN(i)}$ is reached, but always taking into account the actual value of the reflected power $P_{R(i)}$. Thus, the monitoring step e2) is a dynamic or continuous step, in real-time, which may have iterations for continuously adapting to the reflected power $P_{R(i)}$ and incident power $P_{IN(i)}$ variations.

Advantageously, the control means are designed so as, during the monitoring step e2), to carry out, before the sub-step e5), a sub-step e8) that comprises controlling the or each generator so that it delivers an incident power $P_{IN(i)}$ at a value close or substantially equal to the second reference value $V_{T(i)}$.

This sub-step e8) thus makes it possible, before playing on the frequency $f_{(i)}$ during the sub-step e5), to have the incident power $P_{IN(i)}$ come close to its final value, i.e., the set point $VC_{IN(i)}$. Thus, the following sub-steps are successively carried out:

e8) initially, the control means monitor the or each generator to adjust the or each incident power $P_{IN(i)}$ to a value close or equal to the second reference value $V_{T(i)}$;

e5) adjusting the or each frequency $f_{(i)}$ to meet condition a), so as to regulate the or each reflected power $P_{R(i)}$;

e6) and e7) once the or each reflected power $P_{R(i)}$ is regulated, there will be only several watts left to add for the or each incident power $P_{IN(i)}$ to reach its set point $VC_{IN(i)}$.

In one particular embodiment, the facility further comprises at least one magnetic structure designed to create a magnetic resonance field which, combined with the electromagnetic wave, makes it possible to produce an electron cyclotron resonance plasma, and the control means are designed to:

f1) calculate a target frequency $Cf_{(i)}$, for the or each frequency adjustment system, corresponding to a predetermined value of an electron cyclotron resonance surface for the or each application device;

f2) monitor, for each application device, the frequency adjustment system in question to make the frequency $f_{(i)}$ of the electromagnetic wave produced by the or each generator subject to the corresponding set point $Cf_{(i)}$, so that the electron cyclotron resonance surface of the or each application device reaches the corresponding predetermined value.

In the specific case of an electron cyclotron resonance (ECR) plasma excitation technique, the invention thus makes it possible to vary the value of the electron cyclotron resonance surface by varying the frequency of the wave for the application device(s), and therefore monitoring the geometry of the creation areas of the plasma. Varying the resonance surface is an additional advantage of varying the frequency, since that resonance surface is a parameter that influences the characteristics and performance of the plasma.

In one particular embodiment, the or each application device comprises a magnetic structure, and alternatively the magnetic structure is integrated into the treatment chamber and not the application devices.

In the case of this PCR technique, each frequency will correspond to a specific resonance surface, depending on the magnetic structure that is or is not integrated into the application device. Thus, for a same transmitted power, at two different frequencies, the density of the plasma may be different at one point of the volume of the treatment chamber, since the resonance surface varies as a function of the frequency.

For example, for coaxial applicators using permanent magnets, the latter generally being situated at the end of the applicators described above, the resonance area will move away from the plasma application device if the frequency is decreased (since the magnetic field also decreases moving away from the application device), thereby making it possible to increase the active creation surface (excited species, ionized species, radicals, etc.). On the contrary, the creation surface may decrease by increasing the frequency, thereby making it possible to concentrate the creation area close to the application device and therefore increase the density of the plasma locally, although this also increases the losses on the elementary source.

The invention also relates to a method for the microwave treatment of a load, comprising the following steps:

generating at least one electromagnetic wave in the microwave range using at least one solid-state generator;

guiding the or each electromagnetic wave to at least one application device of the electromagnetic wave;

application by the or each application device of the or each electromagnetic wave on the load;

the method being remarkable in that it further comprises a step for automated adjustment of the frequency of the or each electromagnetic wave so as to regulate the reflected power $P_{R(i)}$ on the or each application device and/or regulate the transmitted power $P_{T(i)}$ by the or each application device, with the following steps:

p1) measuring, for the or each application device, the reflected power $P_{R(i)}$ by the corresponding application device; and p2) monitoring the frequency $f_{(i)}$ of the electromagnetic wave produced by the or each generator, until at least one of the following conditions is met;

a) the reflected power $P_{R(i)}$ measured on the or each application device substantially reaches a first reference value $V_{R(i)}$; or b) the transmitted power $P_{T(i)}$ by the or each application device substantially reaches a second reference value $V_{T(i)}$, the transmitted power $P_{T(i)}$ corresponding to the difference between the incident power $P_{IN(i)}$ transmitted to the corresponding application device and the reflected power $P_{R(i)}$ measured on that same application device, i.e., the following relationship:

$$P_{T(i)}=P_{IN(i)}-P_{R(i)}.$$

The automatic steps p1) and p2) are particularly suited for monitoring the reflected power $P_{R(i)}$ allowing the impedance matching (condition a), and for regulating the transmitted power $P_{T(i)}$ in particular making it possible to obtain a uniform heating or plasma (condition b).

According to one possibility of the invention, the generating step comprises generating at least two electromagnetic waves using at least two generators, the guiding step comprises guiding each electromagnetic wave intended for at least one application device, and the adjustment step comprises adjusting the frequency of each electromagnetic wave independently of one another.

According to another possibility of the invention, the generating step comprises generating N electromagnetic waves using N generators, the guiding step comprises guiding the N electromagnetic waves intended for N application devices, where N is an integer greater than 2, and the adjusting step comprises regulating the frequency of each electromagnetic wave independently of one another.

In one particular embodiment, the first reference value $V_{R(i)}$ corresponds, for the or each application device (i), to a minimum of the reflected power $P_{R(i)}$ measured so as to perform impedance matching on the or each application device (i); that minimum optionally being equal or close to zero and, as a reminder, may be set at a given threshold power value or at a given percentage of the ratio of the reflected power to the incident power.

Thus, in this embodiment, the method aims to minimize the reflected power $P_{R(i)}$ on each application device (i) in order to perform the impedance matching.

According to another embodiment where the facility comprises several application devices, the second reference value $V_{T(i)}$ corresponds, for each application device (i), to a predetermined set point $VC_T$ that is identical for each of the application devices (i), so as in particular to favor homogenous heating or the obtainment of a uniform plasma in volume or in surface in a treatment chamber, at a given distance from the wall(s) delimiting said treatment chamber, by distributing the power transmitted to the load between the application devices substantially equitably.

Thus, to regulate the transmitted power $P_{T(i)}$ to an application device (i), the method comprises varying the frequency $f_{(i)}$, and optionally additionally the incident power $P_{IN(i)}$, so that the power transmitted to the application device $P_{T(i)}=P_{IN(i)}-P_{R(i)}$ is equal to the set point $VC_T$ desired for that same application device; $P_{T(i)}$ and $P_{R(i)}$ being functions of the frequency $f_{(i)}$ and the incident power $P_{IN(i)}$. Ultimately, each application device transmits the same power equal to the set point $VC_T$ associated with each application device (i). In this way, the load receives the same power from each application device.

Alternatively, and still in the context of condition b) and the regulation of the transmitted power $P_{T(i)}$, it is also possible to consider the method varying the frequency $f_{(i)}$, and optionally additionally the incident power $P_{IN(i)}$, so that the transmitted power $P_{T(i)}$ varies from one application device (i) to the next. In that case, the second reference values $V_{T(i)}$ are not all identical.

In the event the facility comprises several application devices (i), the method may further comprise a step for establishing or measuring the incident power $P_{IN(i)}$ associated with each application device;

and the monitoring step p2) meets condition b) by carrying out the following sub-steps:

p3) calculating, for each application device (i), a set point $VC_{R(i)}$ of the reflected power $P_{R(i)}$ corresponding to a transmitted power $P_{T(i)}$ by the application device equal to the second reference value $V_{T(i)}$, i.e., $VC_{R(i)}=P_{IN(i)}-V_{T(i)}$;

p4) monitoring, for each application device (i), the frequency $f_{(i)}$ of the electromagnetic wave produced by the associated generator, so as to make the reflected power $P_{R(i)}$ subject to said set point $VC_{R(i)}$.

In this way, a feedback loop is produced on the reflected power $P_{R(i)}$ for each application device (i), by varying the corresponding frequency $f_{(i)}$, so as to meet condition b), and therefore regulate the transmitted power $P_{T(i)}$.

Advantageously, the monitoring step p2) meets conditions a) and/or b), by monitoring, for each application device, both the frequency $f_{(i)}$ of the electromagnetic wave produced by the associated generator and the incident power $P_{IN(i)}$ delivered by that same generator.

In this way, one plays both on the frequency and the incident power to regular the reflected and/or transmitted power, which both depend on the frequency and the incident power.

According to one possibility of the invention, the sub-step p4) comprises monitoring, for each application device (i), both:

the incident power $P_{IN(i)}$ delivered by the concerned generator at a given set point $V_{IN(i)}$ which may be variable; and the frequency $f_{(i)}$ of the electromagnetic wave produced by the associated generator, so as to make the reflected power $P_{R(i)}$ subject to the set point $VC_{R(i)}$ which satisfies the following relationship:

$$VC_{R(i)}=VC_{IN(i)}-V_{T(i)}.$$

This technique is advantageous, as it makes it possible to play both on the frequency $f_{(i)}$ and the incident power $P_{IN(i)}$ to meet condition b), and therefore to regulate the transmitted power $P_{T(i)}$. It is of course understood that it is possible to vary the set point $VC_{IN(i)}$ of the incident power $P_{IN(i)}$ during the adjustment, so as ultimately to obtain the best regulation of the transmitted power $P_{T(i)}$.

In one advantageous embodiment where the facility comprises several application devices, the monitoring step p2) meets both conditions a) and b) by carrying out the following sub-steps:

p5) monitoring the frequency $f_{(i)}$ of the electromagnetic wave produced by the concerned generator until condition a) is met, such that each reflected power $P_{R(i)}$ is equal to the corresponding first reference value $V_{R(i)}$;

p6) calculating, for each application device, a set point $VC_{IN(i)}$ of the incident power $P_{IN(i)}$ corresponding to a transmitted power $P_{T(i)}$ by the application device equal to the second reference value $V_{T(i)}$, i.e., $VC_{IN(i)}=V_{R(i)}+V_{T(i)}$;

p7) adjusting the incident power $P_{IN(i)}$ delivered by the concerned generator to the set point $VC_{IN(i)}$, so as to meet condition b).

This embodiment is advantageous, because it makes it possible to play first on the frequency $f_{(i)}$ to meet condition a) (and therefore ensure regulation of the reflected power $P_{R(i)}$, in particular out of a concern for impedance matching), and next to play on the incident power $P_{IN(i)}$ to meet condition b) (and therefore ensure regulation of the transmitted power $P_{T(i)}$, in particular out of a concern for homogenization of the heating or the plasma).

Of course, during any adjustment of the incident power $P_{IN(i)}$ (step p7)), the value of the reflected power $P_{R(i)}$ may change, and the incident power $P_{IN(i)}$ must therefore effectively vary until its set point $VC_{IN(i)}$ is reached, but always taking into account the actual value of the reflected power $P_{R(i)}$. Thus, the monitoring step p2) is a dynamic or continuous step, in real-time, which may have iterations for continuously adapting to the variations of the reflected powers $P_{R(i)}$ and incident powers $P_{IN(i)}$.

Advantageously, the monitoring step p2) further comprises, before the sub-step p5), a sub-step p8) for adjusting the incident power $P_{IN(i)}$ delivered by the concerned generator to a value close or substantially equal to the second reference value $V_{T(i)}$.

The sub-step p8) thus makes it possible, before playing on the frequency $f_{(i)}$ during the sub-step p5), to have the incident power $P_{IN(i)}$ approach its final value, i.e., the set point $VC_{IN(i)}$.

In the specific case of an electron cyclotron resonance (ECR) plasma excitation technique, the method comprises a step for generating a magnetic resonance field which, combined with the electromagnetic wave, makes it possible to produce an electron cyclotron resonance plasma, and the method further comprises the following steps:

r1) calculating a target frequency $Cf_{(i)}$ corresponding to a predetermined value of the electron cyclotron resonance surface for the or each application device;

r2) making the frequency $f_{(i)}$ of the electromagnetic wave produced by the or each generator subject to the corresponding set point $Cf_{(i)}$ so that the electron cyclotron resonance surface of the or each application device reaches the corresponding predetermined value.

BRIEF DESCRIPTION OF THE DRAWINGS

Other features and advantages of the present invention will appear upon reading the following detailed description of several non-limiting embodiments, done in reference to the appended figures, in which.

DETAILED DESCRIPTION

The following description pertains to a microwave treatment facility 1 for treating a plasma-type load, in other words, a facility for producing a plasma in a treatment chamber. It is of course possible to consider using the facility 1 for other applications, for example with a treatment chamber of the chemical reactor type containing a solid, liquid and/or gaseous product to be treated by microwaves, or in the context of medical treatment by applying microwave radiation on part of the body to be treated.

Figure 1:
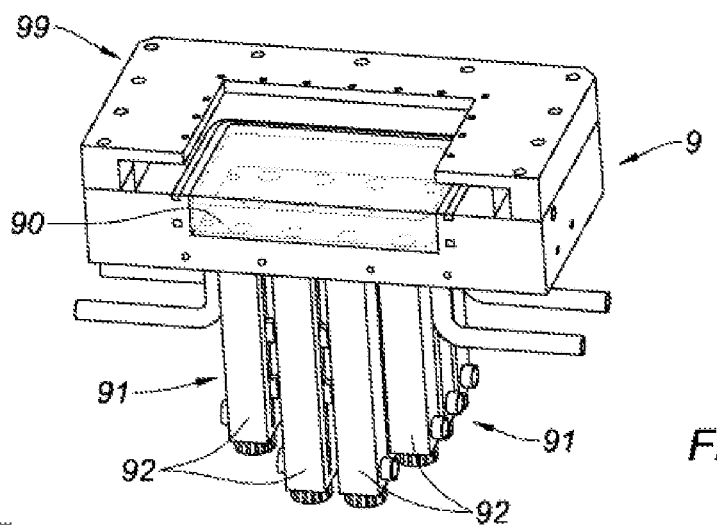
FIG. 1, already discussed, is a diagrammatic perspective and partial cross-sectional view of a reactor for a known microwave treatment facility by plasma production.
Figure 2:
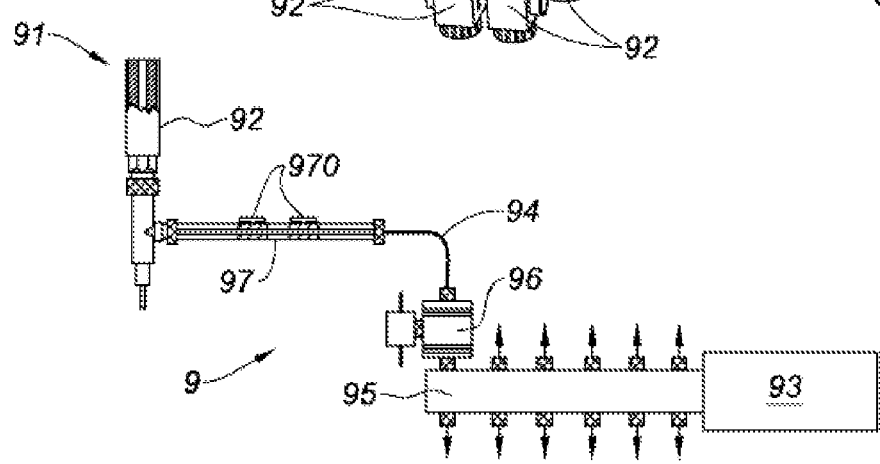
FIG. 2, already discussed, is a partial diagrammatic view of a known microwave treatment facility by plasma production.
Figure 3:
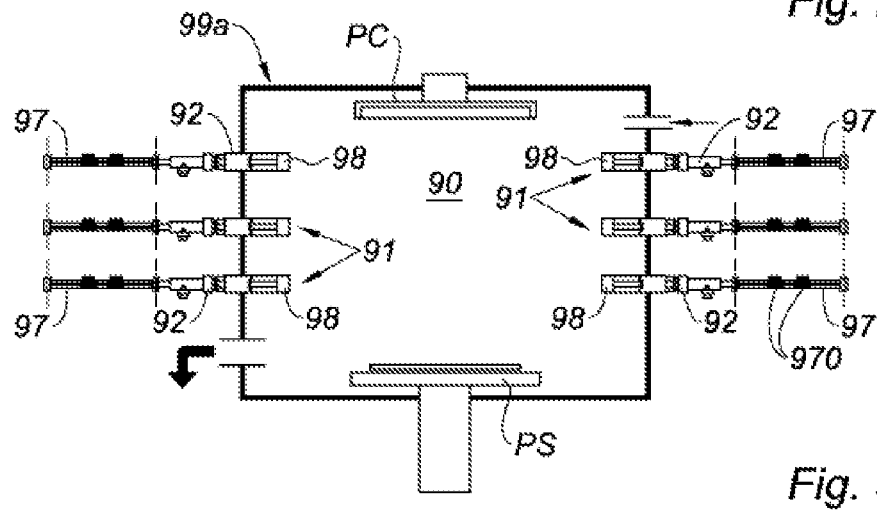
FIG. 3, already discussed, is a partial diagrammatic view of another known microwave treatment facility by plasma production.
Figure 4:
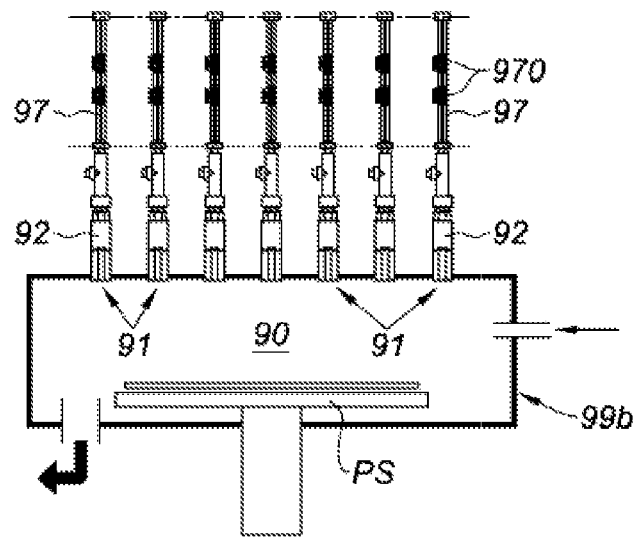
FIG. 4, already discussed, is a partial diagrammatic view of another known microwave treatment facility by plasma production.
Figure 5:
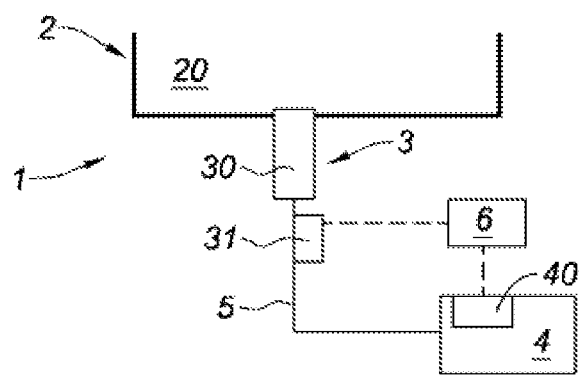
FIG. 5 is a diagrammatic view of a first microwave treatment facility according to the invention.

In a first embodiment of the invention illustrated in FIG. 5, the plasma production facility 1 includes:

a reactor 2 having a treatment chamber 20 in the volume of which the plasma is produced;

an elementary plasma source 3 comprising an application device 30 applying an electromagnetic wave in the microwave range to the inside of the treatment chamber 20, as well as a measurement system 31 for measuring the power reflected by the application device 30;

an electromagnetic wave generator 4 in the microwave range, of the solid-state type, connected to the application device 30 by means 5 for guiding the electromagnetic energy, the generator 4 comprising a frequency adjustment system 40 designed to adjust the frequency of the wave between approximately 2400 and 2500 MHz, or even in another predetermined frequency range; and a controller 6 connected at the input to the measurement system 31 and at the output to the frequency adjustment system 40.

For the rest of the description and the other embodiments:

the or each application device 30 is of the coaxial applicator type, but the invention is not limited to such a coaxial applicator, and other types of devices for applying microwave power may be considered, for example such as a discharge tube (surfatron, Evenson cavity, downstream source, semi-metallic plasma torch, dielectric tube, etc.), an antenna, a waveguide with a dielectric window, etc.

the or each generator 4 is of the solid-state electromagnetic wave generator type, also called transistor generator, which has the advantage of making it possible to monitor the frequency of the electromagnetic wave, manually or automatically, in its operating frequency range (unlike a magnetron);

the or each guide means 5 is made in the form of a coaxial cable that is particularly well suited to be connected directly on a solid-state generator 4, although other forms of guide means may be considered, for example such as waveguides.

The measurement system 31 may be made up of an insulator combining a circulator and a load. When the elementary source emits reflective power, the circulator deflects that power onto the load. By coupling, a fraction of that power is debited and measured. By knowing the debited fraction (or attenuation coefficient), it is possible to deduce the reflected power therefrom. The measurement system may also be a system for measuring parameters S, and in particular S1.1.

The controller 6 is designed for six operating modes.

In a first operating mode, the controller 6:

receives, as input, the reflected power measurement $P_{RM}$ from the measurement system 31;

monitors (or varies) the frequency f of the electromagnetic wave produced by the generator 4 until the reflected power $P_R$ measured by the application device substantially reaches a first reference value $V_R$.

In other words, the controller 6 finds the frequency f for which the reflected power $P_R$ is equivalent to the first reference value $V_R$; that first reference value $V_R$ may be set substantially at a zero value, or at least at the minimum accessible value, so as to match the impedance between the plasma and the elementary source 3.

In a second operating mode, the controller 6:

receives, as input, the reflected power measurement $P_R$ from the measurement system 31;

receives, as input, the value of the incident power $P_{IN}$ on the source, that value coming from the generator 4 to which the controller 6 is connected;

calculating a set point $V_{CR}$ of the reflected power $P_R$ corresponding to a transmitted power $P_T$ equal to a second reference value $V_T$, i.e., $VC_R = P_{IN} - V_T$;

monitoring (or varying) the frequency f of the electromagnetic wave produced by the generator 4 until the reflected power $P_R$ measured by the application device substantially reaches the set point $V_{CR}$.

Thus, the reflected power $P_R$ is subjugated to the set point $VC_R$ to regulate the transmitted power $P_T$ to the second reference value $V_T$. In other words, the controller 6 finds the frequency f for which $P_T = V_T$.

In a third operating mode, the controller 6:

receives, as input, the reflected power measurement $P_R$ from the measurement system 31;

receives, as input, the value of the incident power $P_{IN}$ on the source, said value coming from the generator 4 to which the controller 6 is connected;

monitoring (or varying) both the frequency f and the incident power $P_{IN}$ until the reflected power $P_R$ measured by the application device substantially reaches a first reference value $V_R$.

In other words, the controller 6 finds a pair (frequency f, incident power $P_{IN}$) for which the reflected power $P_R$ is equivalent to the first reference value $V_R$.

For example, for the reflected power $P_R$ to reach a first reference value $V_R$ that is substantially zero, it is possible to consider first that the controller 6 seeks a frequency for which the reflected power $P_R$ is minimal but still greater than zero, and secondly, the controller 6 seeks the incident power $P_{IN}$ for which the reflected power $P_R$ is substantially equal to zero; the incident power $P_{IN}$ only being adjusted if the first reference value $V_R$ cannot be reached by playing only on the frequency.

In a fourth operating mode, the controller 6:

receives, as input, the reflected power measurement $P_R$ from the measurement system 31;

receives, as input, the value of the incident power $P_{IN}$ on the source, that value coming from the generator 4 to which the controller 6 is connected;

monitoring (or varying) both the frequency f and the incident power $P_{IN}$ until the transmitted power $P_T = P_{IN} - P_R$ is substantially equal to a second reference value $V_T$.

In other words, the controller 6 finds a pair (frequency f, incident power $P_{IN}$) for which $P_T = V_T$. For example, for the transmitted power $P_T$ to reach the second reference value $V_T$, it is possible to consider that first, the controller 6 seeks a frequency for which the transmitted power $P_T$ comes closest to the second reference value $V_T$ (without seeking to minimize the reflected power $P_R$) and, secondly, the controller 6 seeks the incident power $P_{IN}$ for which the transmitted power $P_T$ is equal to the second reference value $V_T$; the incident power $P_{IN}$ only being adjusted if the second reference value $V_T$ cannot be reached only by playing on the frequency.

In a fifth operating mode, the controller 6:

receives, as input, the reflected power measurement $P_{RM}$ coming from the measurement system 31;

receives, as input, the value of the incident power $P_{IN}$ on the source, that value coming from the generator 4 to which the controller 6 is connected;

monitoring (or varying) the frequency f until the reflected power $P_R$ substantially reaches a first reference value $V_R$, preferably until the reflected power $P_R$ reaches a minimum;

monitoring (or varying) the incident power $P_{IN}$ until the transmitted power $P_T = P_{IN} - P_R$ is substantially equal to a second reference value $V_T$.

In other words, the controller 6 finds a pair (frequency f, incident power $P_{IN}$) for which $P_R = V_R$ ($P_R$=accessible minimum) and $P_T = V_T$. For the monitoring step of the frequency, it is possible to consider the controller 6 starting from the initial frequency, then varying the frequency f of the side where the reflected power $P_R$ decreases until it finds a minimum.

In a sixth operating mode, the facility is an Electron Cyclotron Resonance (ECR) plasma production facility. In that case, the elementary source 3 further comprises a magnetic structure (not shown) designed to create a magnetic resonance field which, combined with the electromagnetic wave, makes it possible to produce an Electronic Cyclotron Resonance (ECR) plasma.

In this sixth operating mode, the controller 6:

calculates a frequency instruction $Cf_{(i)}$ for the or each frequency adjustment system 40, corresponding to a predetermined value of the resonance surface of the or each elementary plasma source 3; and monitors, for each elementary source 3, the frequency adjustment system 40 in question in order to subjugate the frequency $f_{(i)}$ of the electromagnetic wave produced by the or each generator 4 to the corresponding set point $Cf_{(i)}$ so that the resonance surface of the or each elementary plasma source 3 reaches the corresponding predetermined value.

Figure 6:
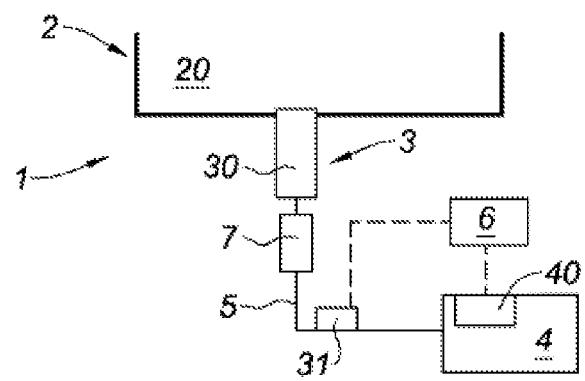
FIG. 6 is a diagrammatic view of a second microwave treatment facility according to the invention.

In a second embodiment of the invention illustrated in FIG. 6, the plasma production facility 1 is identical to that of the first embodiment of FIG. 5, with the exception that it further comprises an impedance matching device 7 positioned upstream from the applicator 30.

This impedance matching device 7 thus makes it possible to perform a first impedance matching, optionally mean, with an adjustment for the operations, before the controller 6 can perform a second fine impedance matching and/or a regulation of the transmitted power, automatic and in real-time during the operations, in particular by implementing the operating modes described above.

Figure 7:
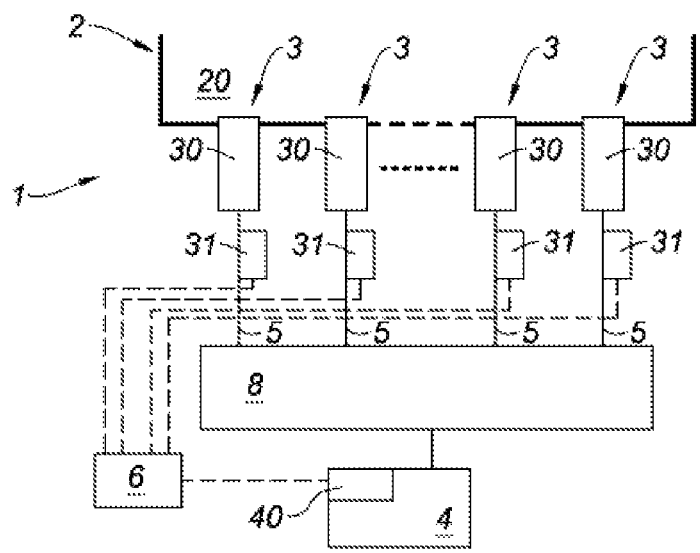
FIG. 7 is a diagrammatic view of a third microwave treatment facility according to the invention.

In a third embodiment of the invention illustrated in FIG. 7, the plasma production facility 1 includes:

a reactor 2 having a treatment chamber 20 in the volume of which the plasma is produced;

several elementary plasma sources 3 each comprising an applicator 30 inside the treatment chamber 20 applying an electromagnetic wave in the microwave range, as well as a measurement system 31 for measuring the power reflected by the corresponding application device 30;

an electromagnetic wave generator 4 in the microwave range, of the solid-state type, connected to the applicators 30 by coaxial cables 5, the generator 4 comprising a frequency adjustment system 40 designed to adjust the frequency of the wave between approximately 2400 and 2500 MHz, or even in another predetermined frequency range; and a controller 6 connected at the input to the measurement system 31 and at the output to the frequency adjustment system 40; and a power divider 8 placed at the output of the generator 4 and designed to divide the microwave power generated by the generator 4 by the number k of elementary sources 3, the power divider 8 having k outputs each connected to an applicator 30 by a coaxial cable 5, each output of the power divider 8 thus debiting 1/k of the total power delivered by the generator 4 to an applicator 30.

The controller 6 is designed to implement the six operating modes described above, with the difference that a single generator 4 is associated with several elementary sources 3. Thus, the controller 6 can:

in the first operating mode: regulate the reflected power $P_{R(i)}$ on each elementary source (i) by playing on the frequency f of the wave generated by the shared generator 4, preferably for impedance matching;

in the second operating mode: regulate the transmitted power $P_{T(i)}$ on each elementary source (i) by playing on the frequency f of the wave generated by the shared generator 4;

in the third operating mode: regulate the reflected power $P_{R(i)}$ on each elementary source (i) by playing on the frequency f of the wave generated by the shared generator 4 and on the incident power $P_{IN(i)}$ on the source (i), knowing that the incident power $P_{IN(i)}$ for the source (i) corresponds to a fraction of the power $P_{GEN}$ of the generator 4 after the power division done by the divider 8;

in the fourth operating mode: performing a regulation of the transmitted power $P_{T(i)}$ on each elementary source (i) by playing on the frequency f of the wave generated by the shared generator 4 and on the incident power $P_{IN(i)}$ on the source (i) (fraction of the power $P_{GEN}$ of the generator 4);

in the fifth operating mode: regulating, for each source (i), the reflected power $P_{R(i)}$ and regulating the transmitted power $P_{T(i)}$ by playing on the frequency f of the wave generated by the shared generator 4 and on the incident power $P_{IN(i)}$ on the source (i) (fraction of the power $P_{GEN}$ of generator 4); and in the sixth operating mode: monitoring the resonance surface, in the creation areas associated with the elementary sources (i), by playing on the frequency f of the wave generated by the shared generator 4.

Of course, this facility has a limitation due to the fact that the generator 4 powers several elementary sources 3, such that the reflected powers $P_{R(i)}$ measured on the various applicators 30 do not all reach exactly a same first reference value $V_{R(i)}$ since a dispersion may exist between the applicators 30 and, further, the elementary sources 3 may interact with each other. The fact nevertheless remains that the controller 6 allows an overall and average regulation of the reflected power and/or the transmitted power, as well as the resonance surface, on all of the elementary sources 3, by playing on the frequency f, and optionally the power $P_{GEN}$, of the wave generated by the signal generator 4.

However, in theory, if the applicators 30 are identical, or more accurately if the microwave lines between the generator 4 and each source 3 are identical, and if the division of the power done by the divider 8 is equitable irrespective of the frequency f, and if the operating conditions are identical at the end of each applicator 30 (in other words, if the plasma is uniform in the vicinity of the applicators 30), then the frequency f may be identical [to] each of the sources 3 so as to perform the impedance matching and/or the transmitted power regulation and/or the monitoring of the resonance surfaces.

Figure 8:
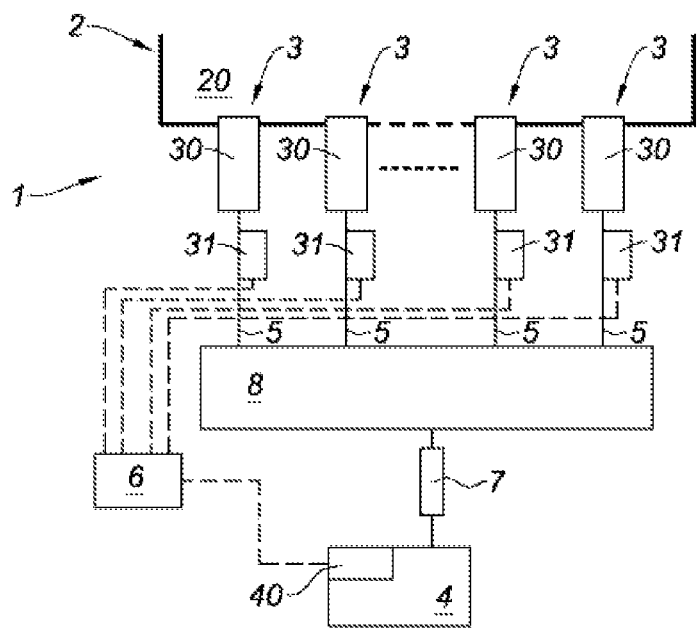
FIG. 8 is a diagrammatic view of a fourth microwave treatment facility according to the invention.

In a fourth embodiment of the invention illustrated in FIG. 8, the plasma production facility 1 is identical to that of the third embodiment of FIG. 7, with the difference that it further comprises an impedance matching device 7 positioned between the generator 4 and the power divider 8.

This impedance matching device 7 thus makes it possible to perform a first impedance matching, optionally mean, with an adjustment prior to the operations, before the controller 6 can perform a second impedance matching for all of the elementary sources 3, automatically and in real-time during the operations. In general, the controller 6 is designed to implement the six operating modes described above, with the difference that an impedance matching shared by all of the sources 3 is done with the shared impedance matching device 7.

Figure 9:
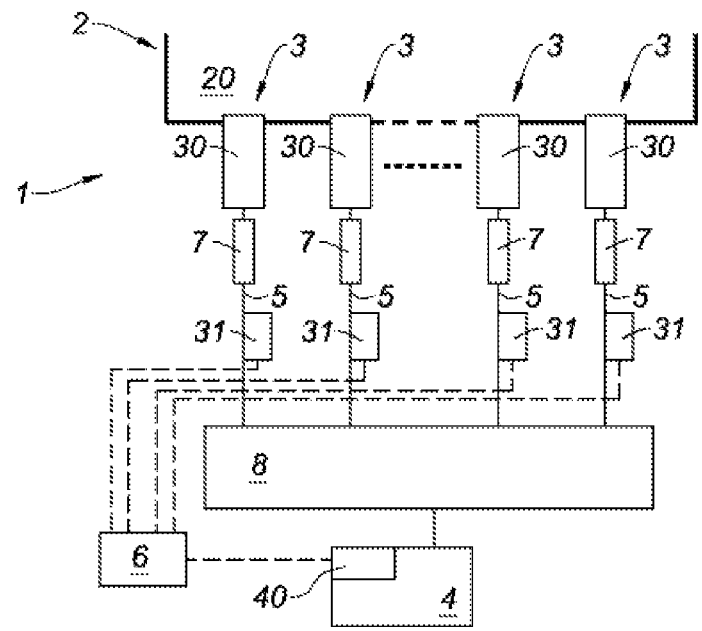
FIG. 9 is a diagrammatic view of a fifth microwave treatment facility according to the invention.

In a fifth embodiment of the invention illustrated in FIG. 9, the plasma production facility 1 is identical to that of the third embodiment of FIG. 7, with the difference that it further comprises several impedance matching devices 7 positioned between the power divider 8 and the applicators 30, with one impedance matching device 7 per applicator 30.

These impedance matching devices 7 thus make it possible to perform a first impedance matching, optionally mean, for each elementary source 3, with an adjustment prior to the operations. Next, the controller 6 makes it possible to perform a second impedance matching for all of the elementary sources 3, automatically and in real-time during the operations. In general, the controller 6 is designed to implement the six operating modes described above, with the difference that an individual impedance matching for each source 3 may be done with each impedance matching device 7, independently from one source 3 to the next. In this way, it is possible to compensate the differences between the applicators 30 (or more accurately between the microwave lines between the generator 4 and each source 3), disparities in the power division done by the divider 8, and lack of homogeneity of the plasma at the end of the applicators 30.

Figure 10:
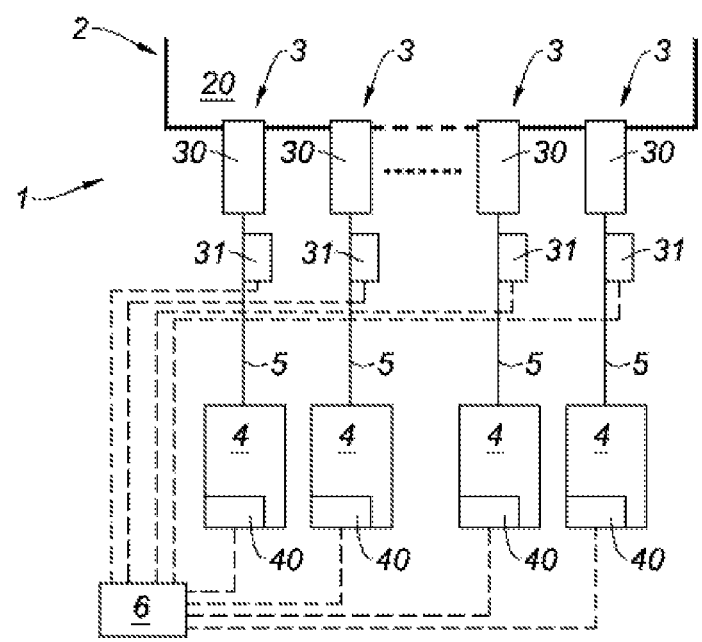
FIG. 10 is a diagrammatic view of a sixth microwave treatment facility according to the invention.

In a sixth embodiment of the invention shown in FIG. 10, the plasma production facility 1 includes:

a reactor 2 having a treatment chamber 20 in the volume of which the plasma is produced;

several elementary plasma sources 3 each comprising an applicator 30 inside the treatment chamber 20 for applying electromagnetic waves in the microwave range, as well as a measurement system 31 for measuring the power reflected by the corresponding application device 30; and several electromagnetic wave generators 4 in the microwave range, of the solid-state type, each connected to an applicator 30 by a coaxial cable 5, with one generator 4 per elementary source 3, each generator 4 comprising a frequency adjustment system 40 designed to adjust the frequency of the wave between approximately 2400 and 2500 MHz, or even in another predetermined frequency range; and a controller 6 connected at the input to the measurement systems 31 of the different elementary sources 3 and at the output to the frequency adjustment systems 40 of the different generators 4.

The controller 6 is designed to implement the six operating modes described above, with the difference that each generator 4 is associated with a single elementary source 3. Thus, the controller 6 can:

in the first operating mode: regulate the reflected power $P_{R(i)}$ on each elementary source (i) (independently from one source to the next) by playing on the frequency $f_{(i)}$ of the wave generated by the associated generator 4, preferably for impedance matching;

in the second operating mode: regulate the transmitted power $P_{T(i)}$ on each elementary source (i) (independently from one source to the next) by playing on the frequency $f_{(i)}$ of the wave generated by the associated generator 4;

in the third operating mode: regulating the reflected power $P_{R(i)}$ on each elementary source (i) by playing on the frequency $f_{(i)}$ of the wave generated by the associated generator 4 and on the incident power $P_{IN(i)}$ on the source (i) (independently from one source to the next), knowing that the incident power $P_{IN(i)}$ for the source (i) substantially corresponds to the power $P_{GEN(i)}$ of the associated generator 4, to within the feed losses (such that playing on the incident power $P_{IN(i)}$ on the source (i) results in playing on the power $P_{GEN(i)}$ of the associated generator 4);

in the fourth operating mode: regulating the transmitted power $P_{T(i)}$ on each elementary source (i) (independently from one source to the next) by playing on the frequency $f_{(i)}$ of the wave generated by the associated generator 4 and on the incident power $P_{IN(i)}$ on the source (i) (and therefore on the power $P_{GEN(i)}$ of the associated generator 4);

in the fifth operating mode: regulating, for each source (i), the reflected power $P_{R(i)}$ and regulating the transmitted power $P_{T(i)}$ by playing on the frequency $f_{(i)}$ of the wave generated by the associated generator 4 and on the incident power $P_{IN(i)}$ on the source (i) (and therefore on the power $P_{GEN(i)}$ of the associated generator 4); and in the sixth operating mode: monitoring the resonance surface, and therefore the creation areas associated with each elementary source (i) (independently from one source to the next), by playing on the frequency $f_{(i)}$ of the wave generated by the associated generator.

Thus, the controller 6 monitors the frequency adjustment systems 31 (monitoring the frequency) and the generators 4 (monitoring the incident power) independently of one another.

For example, in the first operating mode (regulation of the reflected power), for the first elementary source 3, a first reflected power $P_{R(1)}$ is measured, and the controller 6 finds a first frequency $f_{(1)}$ for the first generator 4 allowing that reflected power $P_{R(1)}$ to reach a first reference value $V_{R(1)}$, for example zero or at least minimal. The regulation of the reflected power $P_{R(1)}$ by varying the frequency of the first generator 4 is done using a first feedback loop that concerns only the first elementary source 3 and the first generator 4.

Likewise, for the second elementary source 3, a second reflected power $P_{R(2)}$ is measured, and the controller 6 finds a second frequency $f_{(2)}$ for the second generator 4 allowing that reflected power $P_{R(2)}$ to reach a second reference value $V_{R(2)}$, for example zero or at least minimal. The regulation of the reflected power $P_{R(2)}$ by varying the frequency of the second generator 4 is done using a second feedback loop that concerns only the second elementary source 3 and the second generator 4.

This facility has the advantage, relative to the third, fourth and fifth embodiments, of regulating the power (impedance adaptation) and/or regulating transmitted power and/or monitoring the resonance surfaces for each elementary source 3, independently of one another. This facility thus makes it possible to monitor the power transmitted on each elementary source 3, still independently of one another, for example out of a concern for homogenizing the plasma, by playing on the frequencies of each generator 4, independently of one another.

Figure 11:
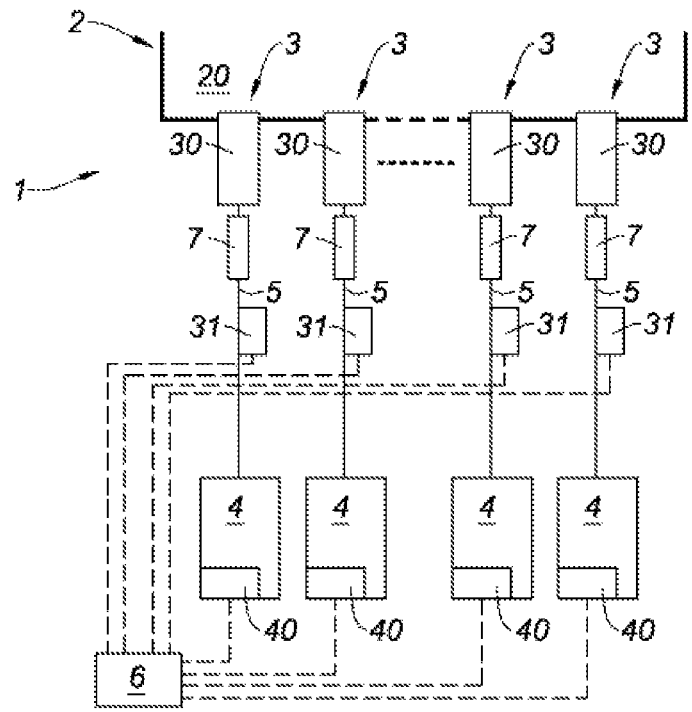
FIG. 11 is a diagrammatic view of a seventh microwave treatment facility according to the invention.

In a seventh embodiment of the invention illustrated in FIG. 11, the plasma production facility 1 is identical to that of the sixth embodiment of FIG. 10, with the difference that it further comprises several impedance matching devices 7 positioned between the generators 4 and the applicators 30, with one impedance matching device 7 per applicator 30.

These impedance matching devices 7 thus make it possible to perform a first impedance matching, optionally mean, for each elementary source 3, with an adjustment prior to the operations. Next, the controller 6 makes it possible to implement the six operating modes described above, for example to perform a second fine impedance matching for each elementary source 3 (first, third and fifth embodiments), independently, automatically and in real-time during the operations for each elementary source.

Figure 12:
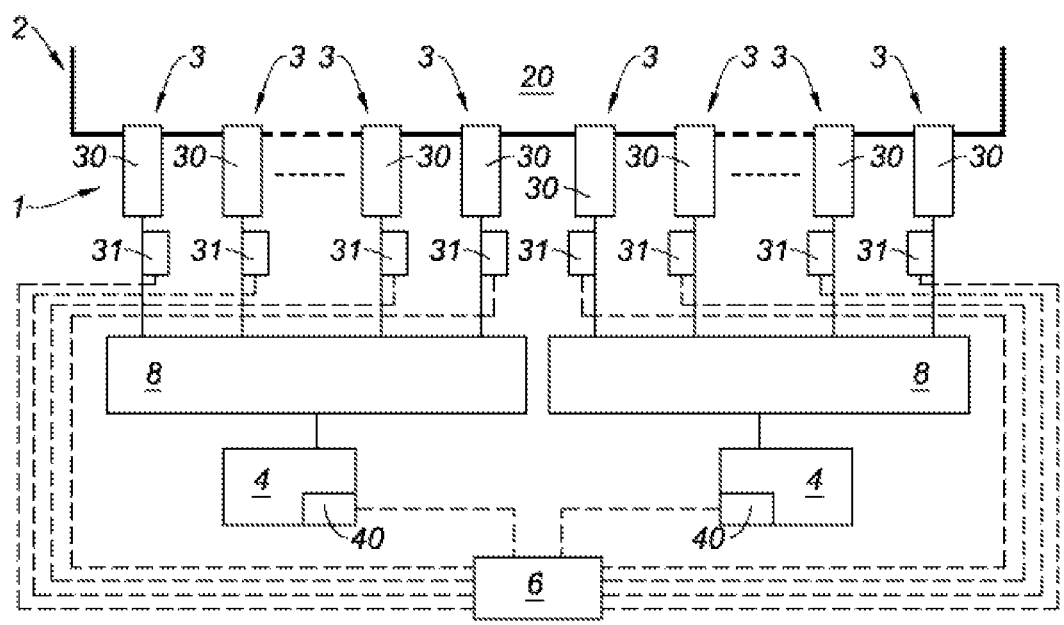
FIG. 12 is a diagrammatic view of an eighth microwave treatment facility according to the invention.

In an eighth embodiment of the invention illustrated in FIG. 12, the plasma production facility 1 comprises a first sub-facility according to the third embodiment of FIG. 7, and a second sub-facility also according to the third embodiment of FIG. 7, where the applicators 30 of the two sub-facilities are positioned within a same treatment chamber 20 of the same reactor 2.

Thus, the first sub-facility comprises:

several elementary plasma sources 3 each comprising an applicator 30 inside the treatment chamber 20 and a measurement system 31 for measuring the power reflected by the corresponding application device 30;

an electromagnetic wave generator 4 in the microwave range, connected to the applicators 30 by coaxial cables 5, the generator 4 comprising a frequency adjustment system 40 designed to adjust the frequency of the wave between approximately 2400 and 2500 megahertz, or even in another predetermined frequency range; and a power divider 8 placed at the output of the generator 4 and having k outputs each connected to an applicator 30 by a coaxial cable 5, each output of the power divider 8 thus debiting 1/k of the total power delivered by the generator 4 to an applicator 30.

Thus, the second sub-facility comprises:

several elementary plasma sources 3 each comprising an applicator 30 inside the same treatment chamber 20 and a measurement system 31 for measuring the power reflected by the corresponding application device 30;

an electromagnetic wave generator 4 in the microwave range, of the solid-state type, connected to the applicators 30 by coaxial cables 5, the generator 4 comprising a frequency adjustment system 40 designed to adjust the frequency of the wave between approximately 2400 and 2500 megahertz, or even in another predetermined frequency range; and a power divider 8 placed at the output of the generator 4 and having m outputs (where m is not necessarily equal to k) each connected to an applicator 30 by a coaxial cable 5, each output of the power divider 8 thus debiting 1/m of the total power delivered by the generator 4 to the applicator 30.

Furthermore, the facility 1 comprises a controller 6 connected at the input to the measurement systems 31 of all of the elementary sources 3, and at the output to the frequency adjustment systems 40 of the two generators 4.

Of course, it is possible to consider, in one and/or the other of the two sub-facilities, providing one impedance matching device per generator (as in the case of the fourth embodiment of FIG. 8) or one impedance matching device per applicator (as in the case of the fifth embodiment of FIG. 8).

It is also possible to consider adding a new sub-assembly, or replacing one of the two sub-assemblies with a new sub-assembly, that new sub-assembly being able to be of the type of the first, second, sixth or seventh embodiments, with one generator per applicator. In that case, the facility still comprises a single controller connected to the different measurement systems 31 and the different frequency adjustment systems 40.

Of course, the example embodiment mentioned above is in no way limiting, and other improvements and details may be added to the facility according to the invention, without going beyond the scope of the invention, where other forms of application device and/or guide means for guiding the electromagnetic wave may for example be produced.

The invention claimed is:

1. A method for the microwave treatment of a plasma-type load for producing a plasma in a treatment chamber, comprising the following steps:
   - generating at least one electromagnetic wave in the microwave range using at least one solid-state generator;
   - providing several elementary plasma sources, each comprising one application device for applying an electromagnetic wave to the inside of the treatment chamber, and a measurement system for measuring a reflected powers $P_{R(i)}$ which is a power reflected on the corresponding application device due to impedance mismatch;
   - guiding the electromagnetic wave from the at least one solid-state generator to the application devices of the elementary plasma sources without using any matching device between the solid-state generator and each application device;
   - application by each application device of the electromagnetic wave on the plasma-type load to the inside of the treatment chamber;

wherein the method further comprises a step for automated adjustment of the frequency $f_{(i)}$ of the at least one electromagnetic wave so as to minimize the reflected powers $P_{R(i)}$ on the application devices measured by the measurement systems, with the following steps:
   - p1) measuring by the measurement systems, for the application devices, the reflected power $P_{R(i)}$ on the application devices; and
   - p2) varying the frequency $f_{(i)}$ of the electromagnetic wave produced by the generator, until the reflected powers $P_{R(i)}$ measured on the application devices reaches minimum so as to perform impedance matching on the application devices only by varying said frequency $f_{(i)}$ such as said method performs impedance matching without using any matching device.

2. The method according to claim 1, wherein the generating step comprises generating at least two electromagnetic waves using at least two generators, the guiding step comprises guiding each electromagnetic wave intended for at least one application device, and the adjustment step comprises adjusting the frequency of each electromagnetic wave independently of one another.

3. The method according to claim 1, wherein the generating step comprises generating N electromagnetic waves using N generators, the guiding step comprises guiding the N electromagnetic waves intended for N application devices, where N is an integer greater than 2, and the adjusting step comprises regulating the frequency of each electromagnetic wave independently of one another.

4. The method according to claim 1, wherein the minimum of the measured reflected power $P_{R(i)}$ is equal or close to zero.

* * * * *